(12) United States Patent
Fan et al.

(10) Patent No.: US 12,219,849 B2
(45) Date of Patent: Feb. 4, 2025

(54) ARRAY SUBSTRATE AND DISPLAY APPARATUS

(71) Applicant: BOE TECHNOLOGY GROUP CO., LTD., Beijing (CN)

(72) Inventors: Xing Fan, Beijing (CN); Xin Li, Beijing (CN); Cheng Han, Beijing (CN); Yansong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/772,245

(22) PCT Filed: May 26, 2021

(86) PCT No.: PCT/CN2021/096060
§ 371 (c)(1),
(2) Date: Apr. 27, 2022

(87) PCT Pub. No.: WO2022/246689
PCT Pub. Date: Dec. 1, 2022

(65) Prior Publication Data
US 2024/0147803 A1 May 2, 2024

(51) Int. Cl.
*H10K 59/35* (2023.01)
*H10K 59/124* (2023.01)
*H10K 102/00* (2023.01)

(52) U.S. Cl.
CPC ......... *H10K 59/353* (2023.02); *H10K 59/124* (2023.02); *H10K 2102/311* (2023.02)

(58) Field of Classification Search
CPC .............. H10K 59/353; H10K 59/124; H10K 2102/311; H10K 77/10; H10K 59/35; H01L 21/77
See application file for complete search history.

(56) References Cited

U.S. PATENT DOCUMENTS

| 10,707,285 B2 | 7/2020 | Kwon et al. |
| 2009/0115326 A1 | 5/2009 | Chan et al. |

(Continued)

FOREIGN PATENT DOCUMENTS

| CN | 202330954 U | 7/2012 |
| CN | 107221553 A | 9/2017 |

(Continued)

*Primary Examiner* — Kevin Quarterman
(74) *Attorney, Agent, or Firm* — HOUTTEMAN LAW LLC

(57) ABSTRACT

An array substrate and a display apparatus are provided The array substrate includes: at least one adjusting portion on the base substrate and having a first cross section in a plane perpendicular to the base substrate; first cross section includes top and bottom sides, first and second lateral sides; the bottom side is closer to the base substrate than the top side, an orthographic projection of the top side on the base substrate is within an orthographic projection of the bottom side on the base substrate; the first and/or second lateral sides is/are stepped; a buffer layer on a side of the adjusting portion away from the base substrate; light-emitting devices on a side of the buffer layer away from the base substrate and each including a first electrode, a light-emitting layer and a second electrode sequentially arranged along a direction away from the base substrate.

20 Claims, 3 Drawing Sheets

(56) References Cited

U.S. PATENT DOCUMENTS

| | | | | |
|---|---|---|---|---|
| 2011/0149600 A1* | 6/2011 | Jang | ................. | H01L 33/642 |
| | | | | 362/612 |
| 2011/0149601 A1* | 6/2011 | Jang | ................. | H01L 25/0753 |
| | | | | 362/612 |
| 2013/0099258 A1* | 4/2013 | Lim | ................. | H10K 59/871 |
| | | | | 257/E51.02 |
| 2014/0151651 A1 | 6/2014 | Jin et al. | | |
| 2015/0001477 A1* | 1/2015 | Namkung | ............ | H10K 59/124 |
| | | | | 257/40 |
| 2019/0165052 A1* | 5/2019 | Son | ................. | G02B 27/0172 |
| 2019/0198793 A1* | 6/2019 | Guo | ................. | H10K 59/80515 |
| 2019/0334102 A1 | 10/2019 | Fan | | |
| 2019/0386077 A1 | 12/2019 | He et al. | | |

FOREIGN PATENT DOCUMENTS

| | | |
|---|---|---|
| CN | 107464825 A | 12/2017 |
| CN | 108598122 A | 9/2018 |
| CN | 208256730 U | 12/2018 |
| CN | 110323349 A | 10/2019 |
| CN | 111740029 A | 10/2020 |
| CN | 112531129 A | 3/2021 |
| CN | 214225625 U | 9/2021 |
| TW | 200922371 A | 5/2009 |

* cited by examiner

ARRAY SUBSTRATE AND DISPLAY APPARATUS

TECHNICAL FIELD

The present disclosure relates to the field of display technology, and in particular, to an array substrate and a display apparatus.

BACKGROUND

Organic Light-Emitting diodes (OLEDs), when used as display devices, have the advantages of a wide viewing angle, a fast response, a wide color gamut, etc., and thus, become the mainstream development trend of the next generation display technology.

However, a cathode made of metal (a metal cathode) and a reflective anode at the bottom in a top-emitting organic electroluminescent device form a resonant cavity (a microcavity structure), so that light with a wavelength satisfying a resonance condition is enhanced due to the constructive interference. A distance of the light traveling between the metal cathode and the reflective anode at the bottom varies with a viewing angle. That is, paths of the light are different at different viewing angles, causing luminance and chromaticity differences at different viewing angles. Therefore, the current top-emitting organic electroluminescent device has a serious problem of a color shift caused by different viewing angles.

SUMMARY

The present disclosure intends to solve at least one of the problems of the related art, and provides an array substrate and a display apparatus.

In a first aspect, an embodiment of the present disclosure provides an array substrate, including:
  a base substrate;
  at least one adjusting portion on the base substrate, wherein the at least one adjusting portion has a first cross section in a plane perpendicular to the base substrate; the first cross section includes a top side and a bottom side, and a first lateral side and a second lateral side; wherein the bottom side is closer to the base substrate than the top side, and an orthographic projection of the top side on the base substrate is within an orthographic projection of the bottom side on the base substrate; at least one of the first lateral side and the second lateral side is stepped;
  a buffer layer on a side of the at least one adjusting portion away from the base substrate; and
  a plurality of light-emitting devices on a side of the buffer layer away from the base substrate, wherein each of the plurality of light-emitting devices includes a first electrode, a light-emitting layer and a second electrode which are sequentially arranged along a direction away from the base substrate; and an orthographic projection of a first electrode of each of at least some of the plurality of light-emitting devices on the base substrate at least covers an orthographic projection of a respective one of the at least one adjusting portion on the base substrate.

In some embodiments, the first lateral side and the second lateral side are stepped, and are symmetrically arranged about a line passing through middle points of the top side and the bottom side as a symmetric axis.

In some embodiments, the at least one adjusting portion includes a plurality of adjusting sub-structures sequentially stacked along the direction away from the base substrate, and areas of the plurality of adjusting sub-structures decrease sequentially along the direction away from the base substrate.

In some embodiments, the plurality of adjusting sub-structures include two adjusting sub-structures.

In some embodiments, each of the plurality of adjusting sub-structures is made of an inorganic material.

In some embodiments, the plurality of light-emitting devices form a plurality of pixel units, light-emitting devices in each of the plurality of pixel units includes a red light-emitting device, a green light-emitting device, and a blue light-emitting device; and an orthographic projection of a first electrode of the blue light-emitting device on the base substrate covers an orthographic projection of the at least one adjusting portion on the base substrate.

In some embodiments, the at least one adjusting portion includes a plurality of adjusting portions separated from each other; and first electrodes of at least some of the plurality of light-emitting devices covers the plurality of adjusting portions.

In some embodiments, the array substrate includes a flat region and at least one bending region; and an orthographic projection of a first electrode of each of at least some of the plurality of light-emitting devices in the at least one bending region on the base substrate covers an orthographic projection of the at least one adjusting portion on the base substrate.

In some embodiments, the buffer layer is made of an organic material.

In a second aspect, an embodiment of the present disclosure provides a display apparatus, which includes the above array substrate.

DETAIL DESCRIPTION OF EMBODIMENTS

Figure 1:
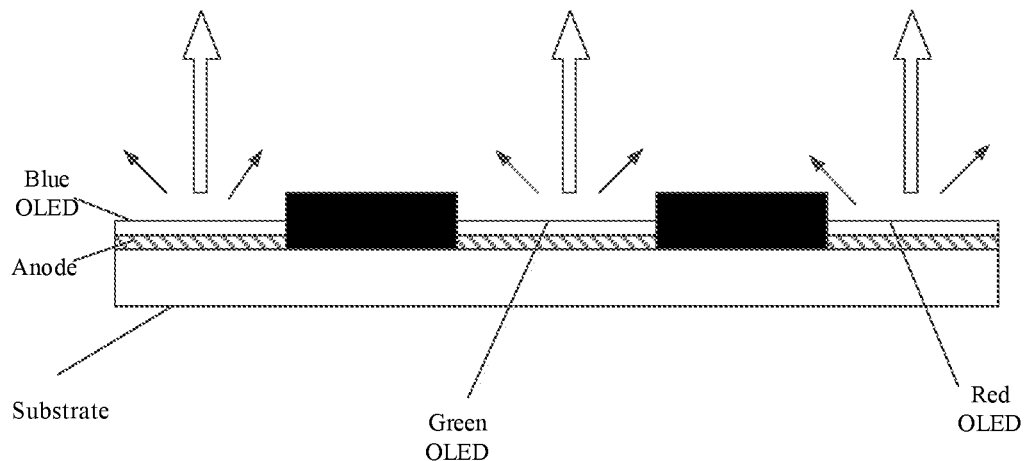
FIG. 1 is a schematic diagram illustrating light outgoing from an exemplary array substrate.

In order to enable one of ordinary skill in the art to better understand the technical solutions of the present disclosure, the present disclosure will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Light-emitting devices employed in the embodiments of the present disclosure will be explained, and then, the embodiments of the present disclosure will be described. The light-emitting devices in the embodiments of the present disclosure include, but are not limited to, organic electroluminescent devices OLEDs. As an example, the light-emitting devices are the OLEDs. An OLED includes a first electrode, an organic functional layer and a second electrode which are sequentially arranged along a direction away from a base substrate. The first electrode may be an anode of the light-emitting device, and may include two layers of Indium Tin Oxide (ITO) and a metal material with good conductivity sandwiched therebetween. For example, the metal material may be any one of aluminum (Al), silver (Ag), titanium (Ti), and molybdenum (Mo), or an alloy formed by any of the foregoing materials. The organic functional layer may include a light-emitting layer, which is made of a small molecule organic material or a polymer molecule organic material, may be a fluorescent light-emitting material or a phosphorescent light-emitting material, may emit red light, green light, blue light, or white light, and the like. In addition, according to different actual needs, in different examples, the organic functional layer may further include an electron injection layer, an electron transport layer, a hole injection layer, a hole transport layer, and other functional layers. The second electrode covers the organic functional layer, and may have a polarity opposite to that of the first electrode, and may be a cathode of the light-emitting device, which may be made of any one of metal materials such as lithium (Li), aluminum (Al), magnesium (Mg), and silver (Ag), or an alloy formed by any of the foregoing materials.

The OLED is classified into a top emission type and a bottom emission type according to a light outgoing direction. In the bottom emission type OLED, the light is emitted outward at a side where the base substrate is located, and a cathode is generally made of a metal material and is used as a reflective electrode. In the top emission type OLED, the light is emitted from a cathode, the cathode may also be made of a metal material. However, it is necessary to evaporate a thin metal material to form the cathode, so that the light may be emitted from the cathode. Correspondingly, an anode of the top emission type OLED may be a reflective anode, or a reflective layer may be disposed on a side of the anode close to the base substrate, so that the light may be emitted from the cathode. The following embodiments will be described below by taking an example in which the OLED is the top emission type OLED and the anode is a reflective anode.

FIG. 1 is a schematic diagram illustrating light outgoing from an exemplary array substrate. As shown in FIG. 1, the array substrate includes a base substrate, and a plurality of pixel units disposed on the base substrate, each pixel unit including a plurality of OLEDs. In the following description, as an example, each pixel unit include a blue OLED, a green OLED, and a red OLED. An anode, a cathode and a light-emitting layer of each OLED form a micro-cavity structure together, where light emitted by the light-emitting layer may be reflected back and forth for multiple times in a micro-cavity and finally emitted from a light outgoing side of the anode. Almost all light is vertically emitted from the light outgoing side of the anode of each OLED device with respect to a plane in which the base substrate is located, and less light is emitted in a non-vertical direction. A luminance of light emitted by the blue OLED is attenuated faster with the increase of the viewing angle than that of light emitted by the red OLED or the green OLED. That is, an amount of the light of the blue OLED in the non-vertical direction (an amount of the non-vertical light of the blue OLED) is the least, so that there is a certain color shift in the light emitted by the green OLEDs, the red OLEDs, and the blue OLEDs in pixel units at different positions after being mixed.

In order to solve the above technical problem, the embodiment of the present disclosure provides the following technical solutions.

It should be noted that in the drawings in the following embodiments, only the anode of the light-emitting device is shown, and the light-emitting layer and the cathode are not shown, but it should be known by one of ordinary skill in the art that the anode, the organic functional layer and the cathode of the light-emitting device are sequentially formed on the base substrate, which is known in the prior art, and will not be described in detail herein.

Figure 2:
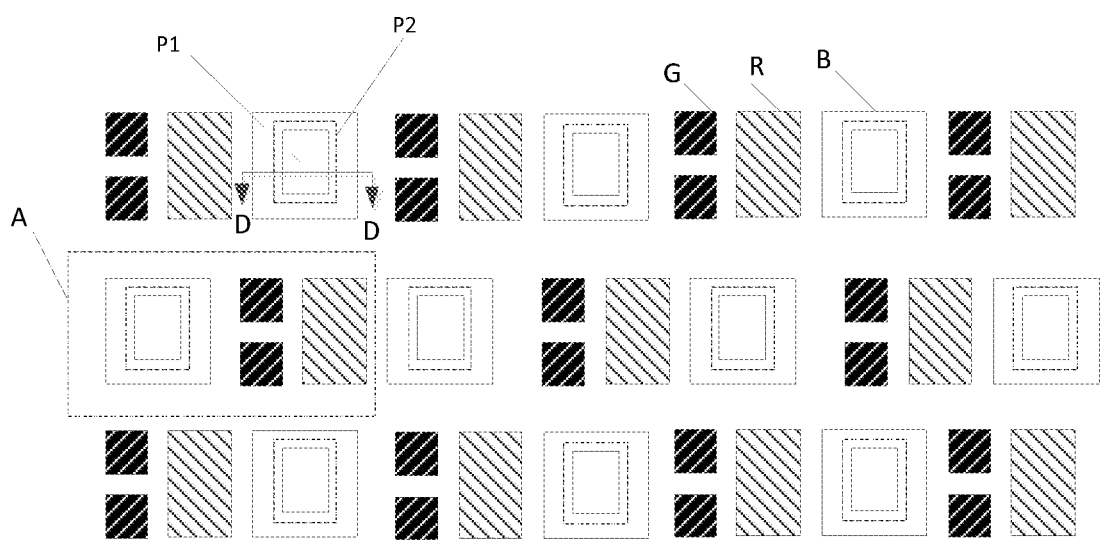
FIG. 2 is a schematic diagram of a structure of an array substrate according to an embodiment of the present disclosure.
Figure 3:
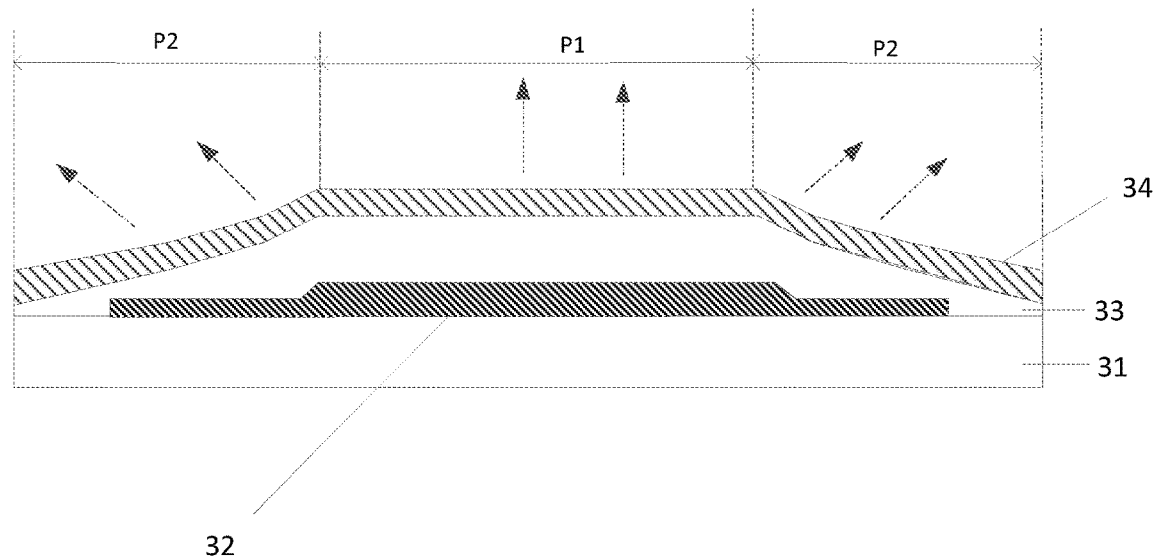
FIG. 3 is a schematic cross-sectional view of a structure of a blue light-emitting device shown in FIG. 2 along a direction D-D.

In a first aspect, the embodiment of the present disclosure provides an array substrate. FIG. 2 is a schematic diagram of a structure of an array substrate according to an embodiment of the present disclosure. As shown in FIG. 2, the array substrate includes a plurality of pixel units arranged in an array on a base substrate (not shown in the figures), where each pixel unit A includes a green light-emitting device G, a red light-emitting device R, and a blue light-emitting device B. For example, each pixel unit A includes one red light-emitting device R, two green light-emitting devices G, and one blue light-emitting device B. Alternatively, each pixel unit A includes one red light-emitting device R, one green light-emitting device G, and one blue light-emitting device B. FIG. 3 is a schematic cross-sectional view of a structure of a blue light-emitting device shown in FIG. 2 along a direction D-D. As shown in FIG. 3, an adjusting portion 32 is provided on the base substrate 31, a buffer layer 33 is provided on a side of the adjusting portion 32 away from the base substrate 31, an anode 34 of the blue light-emitting device is provided on a side of the buffer layer 33 away from the base substrate 31, and an orthographic projection of the anode 34 of the blue light-emitting device on the base substrate 31 covers an orthographic projection of the adjusting portion 32 on the base substrate.

It should be noted that the red light-emitting device R includes, but is not limited to, an organic electroluminescent device OLED, the green light-emitting device G includes, but is not limited to, an organic electroluminescent device OLED, the blue light-emitting device B includes, but is not limited to, an organic electroluminescent device OLED. In the embodiment, as an example, the red light-emitting device R, the green light-emitting device G, and the blue light-emitting device B are all OLEDs.

In the present embodiment, the adjusting portion 32 has a first cross section in a plane perpendicular to the base substrate 31, and the first cross section includes a top side, a bottom side, a first lateral side and a second lateral side. The bottom side is closer to the base substrate 31 than the top side, an orthographic projection of the top side on the base substrate 31 is located within an orthographic projection of the bottom side on the base substrate 31, and at least one of the first lateral side and the second lateral side is stepped. In this case, with the base substrate 31 as a reference plane, the anode of the blue light-emitting device B formed on the adjusting portion 32 includes not only a flat top surface (a region shown by P1 in FIG. 3) but also stepped side surfaces (regions shown by P2 in FIG. 3). The amount of reflection of light in the non-vertical direction is adjusted by setting the number of steps of the stepped side surfaces and a width and a height of each step, thereby improving the luminance ratio of the light-emitting devices of different colors in each pixel unit, and further improving the display effect.

It should be noted that both lateral sides of the first cross section of the adjusting portion 32 are illustrated as being stepped in FIG. 3. Alternatively, it is within the scope of the present disclosure that at least one lateral side of the adjusting portion 32 is stepped.

In some embodiments, as shown in FIG. 3, the first and second lateral sides of the first cross section of the adjusting portion 32 are symmetrically disposed about a line passing through middle points of the top and bottom sides as a symmetric axis, and are stepped and have a same shape. In the embodiment of the present disclosure, the first lateral side and the second lateral side of the adjusting portion 32 are symmetrically disposed about the line passing through the middle points of the top and bottom sides as the symmetric axis, so that an amount of the light reflected from side surfaces of the adjusting portion 32 is ensured to be uniform, thereby ensuring the uniformity of the display.

Figure 4:
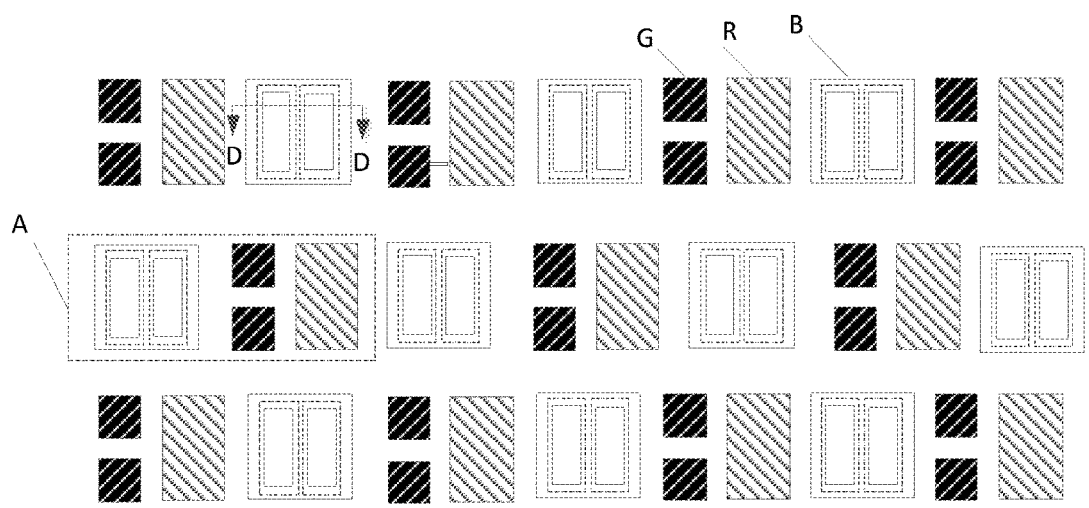
FIG. 4 is a schematic diagram of another structure of an array substrate according to an embodiment of the present disclosure.
Figure 5:
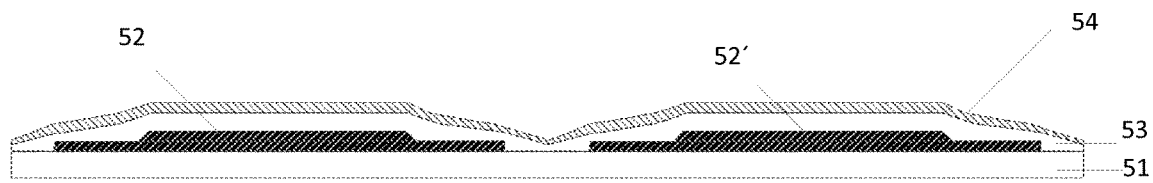
FIG. 5 is a schematic cross-sectional view of a structure of a blue light-emitting device shown in FIG. 4 along a direction D-D.

In some embodiments, FIG. 4 is a schematic diagram of another structure of an array substrate according to an embodiment of the present disclosure. As shown in FIG. 4, the array substrate includes a plurality of pixel units A arranged in an array on a base substrate (not shown in the figures), where each pixel unit includes a green light-emitting device G, a red light-emitting device R, and a blue light-emitting device B. For example: each pixel unit A includes one red light-emitting device R, two green light-emitting devices G, and one blue light-emitting device B. Alternatively, each pixel unit A includes one red light-emitting device R, one green light-emitting device G, and one blue light-emitting device B. FIG. 5 is a schematic cross-sectional view of a structure of a blue light-emitting device B shown in FIG. 4 along a direction D-D. As shown in FIG. 5, two adjusting portions are provided on a side of any one of the blue light-emitting devices B of the array substrate close to the base substrate 51, and are denoted as a first adjusting portion 52 and a second adjusting portion 52', respectively. A buffer layer 53 is provided on a side of the first adjusting portion 52 and the second adjusting portion 52' away from the base substrate; an anode 54 of the blue light-emitting device B is disposed on a side of the buffer layer 53 away from the base substrate, and an orthographic projection of the anode 54 of the blue light-emitting device B on the base substrate 51 covers an orthographic projection of the first and second adjusting portions 52, 52' on the base substrate 51. The first and second adjusting portions 52, 52' are separated from each other, and have an identical structure, and each of the first and second adjusting portions 52, 52' has a first cross section in a plane perpendicular to the base substrate 51, and each first cross section includes a top side, a bottom side, a first lateral side and a second lateral side. The bottom side is closer to base substrate 51 than the top side, and an orthographic projection of the top side on the base substrate 51 is located within an orthographic projection of the bottom side on the base substrate 51. The first lateral side and the second lateral side of each first cross section are symmetrically disposed about a line passing through middle points of the top and bottom sides as a symmetric axis, and are stepped.

In this embodiment, the adjusting portions (52, 52') are provided in the array substrate, and the lateral sides of the first cross-section of each of the adjusting portions (52, 52') are stepped, so that the anode of the blue light-emitting device B form slight slopes at the stepped lateral sides of the adjusting portions (52, 52'), and the amount of blue light in the non-vertical direction reflected from the anode of the blue light-emitting device B is increased. In this way, the matching of the viewing angles of the blue light, the red light and the green light is improved, and the problem of the color shift in the white light is solved. In addition, a plurality of adjusting portions (such as 52, 52') separated from each other are provided below the anode of the blue light-emitting device B, so that a proportion of an area of slope surface regions P2 of the anode may be increased effectively, and thus, the color shift in the white light may be finely adjusted.

It should be noted that in the embodiment of the present disclosure, as an example, two adjusting portions (52, 52') are provided below the blue light-emitting device B. It should be understood that a plurality of adjusting portions may also be provided below the blue light-emitting device B according to specific conditions to improve the color shift. For example, three or four adjusting portions may be provided below the blue light-emitting device B. When a plurality of adjusting portions are provided below the blue light-emitting device B, a distance between any two adjacent adjusting portions is constant, and the plurality of adjusting portions have a same size and a same shape, so as to ensure the display uniformity.

It should be noted that in the above embodiments, the one or more adjusting portions are disposed below the blue light-emitting device B as an example. Alternatively, it should be understood by one of ordinary skill in the art that one or more adjusting portions may also be disposed below an anode of an OLED of any color as needed, which is within the protection scope of the present disclosure.

For example, one or more adjusting portions may be disposed below the blue light-emitting device B and the red light-emitting device R at the same time. The amount of reflection of light in the non-vertical direction is adjusted by setting the number of steps of the stepped side surfaces of the one or more adjusting portions below the blue light-emitting device B and the red light-emitting device R and a width and a height of each step, thereby improving the luminance ratio of the green, red and blue light-emitting devices, and further improving the display effect.

In some embodiments, each of the one or more adjusting portions of the array substrate includes a plurality of adjusting sub-structures stacked in sequence along a direction away from the base substrate, and areas of the plurality of adjusting sub-structures decreases in sequence along the direction away from the base substrate, so that the plurality of adjusting sub-structures are stacked in sequence along the direction away from the base substrate to form each adjusting portion with stepped lateral sides, and the anode of the light-emitting device formed on the adjusting portion may form slight slopes at two stepped lateral sides of each adjusting portion.

Figure 6:
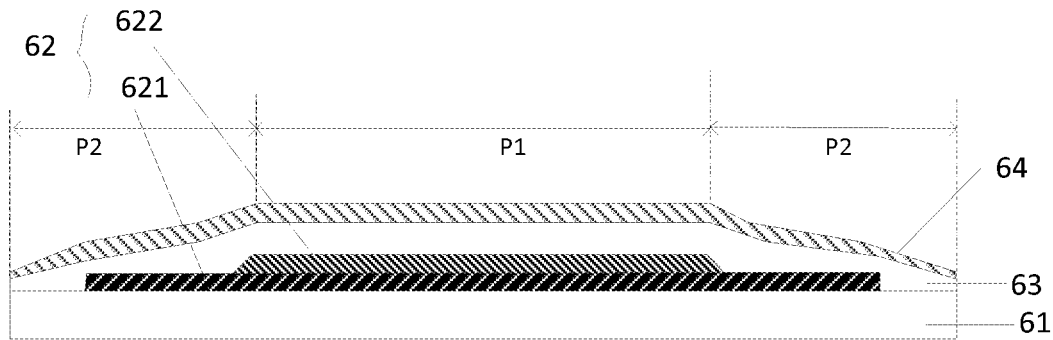
FIG. 6 is a schematic cross-sectional view of another structure of a blue light-emitting device shown in FIG. 2 along a direction D-D.

For example, FIG. 6 is a schematic cross-sectional view of another structure of a blue light-emitting device B shown in FIG. 2 along a direction D-D. As shown in FIG. 6, an adjusting portion 62 includes a first adjusting sub-structure 621 and a second adjusting sub-structure 622, wherein the first adjusting sub-structure 621 is disposed on the base substrate 61, the second adjusting sub-structure 622 is disposed on a side of the first adjusting sub-structure 621 away from the base substrate 61, and an area of the first adjusting sub-structure 621 is larger than an area of the second adjusting sub-structure 622, so that at least one lateral side of the first cross section of the adjusting portion 62 is stepped. A buffer layer 63 is provided on a side of the adjusting portion 62 away from the base substrate 61, and an anode 64 of the blue light-emitting device B is provided on a side of the buffer layer 63 away from the base substrate 61. In this embodiment, materials of the first adjusting sub-structure 621 and the second adjusting sub-structure 622 are both inorganic materials, so that the first adjusting sub-structure 621 and the second adjusting sub-structure 622 may be formed to be very thin, thereby reducing a thickness of the array substrate. Etching patterns of the first adjusting sub-structure 621 and the second adjusting sub-structure 622 may be optimized in detail through a process including a dry etching process or a wet etching process by designing an exposure mask.

For example, a material of the buffer layer 63 is an organic material, so that a shape of the buffer layer 63 may be controlled more easily, the buffer layer 63 may easily form slight slopes at each adjusting portion 62 with two stepped lateral sides, and the buffer layer 63 on each adjusting portion may be prevented from cracking, and a point discharge of each adjusting portion 62 may be avoided. The buffer layer 63 may be formed through processes including, but not being limited to, PECVD, photoresist coating, etching, or the like. A shape of the anode 64 in this embodiment may be realized by adjusting thicknesses, widths and edge angles of the first adjusting sub-structure 621, the second adjusting sub-structure 622 and the buffer layer 63, thereby realizing an adjustment for coverage areas of the anode flat region P1 and the anode slope regions P2. In this embodiment, the first adjusting sub-structure 621 and the second adjusting sub-structure 622 form each adjusting portion 62 with two stepped lateral sides, so that the reflection amount of the non-vertical light is adjusted, the luminance ratio of the light-emitting devices of different colors in each pixel unit is improved, and the display effect is improved.

It should be noted that in this embodiment, as an example, the material of each adjusting sub-structure is the inorganic material, and the material of the buffer layer is an organic material. Alternatively, the materials of the adjusting sub-structures and the buffer layer may also be other types of materials, and are not illustrated here.

In addition, in the embodiment of the present disclosure, as an example, each adjusting portion includes two adjusting sub-structures. Alternatively, three or more adjusting sub-structures may be provided to form each adjusting portion as needed. In this case, an area and a thickness of each of the adjusting sub-structures of respective layers may be adjusted to achieve different amounts of the non-vertical light, which is not illustrated here.

Figure 7:
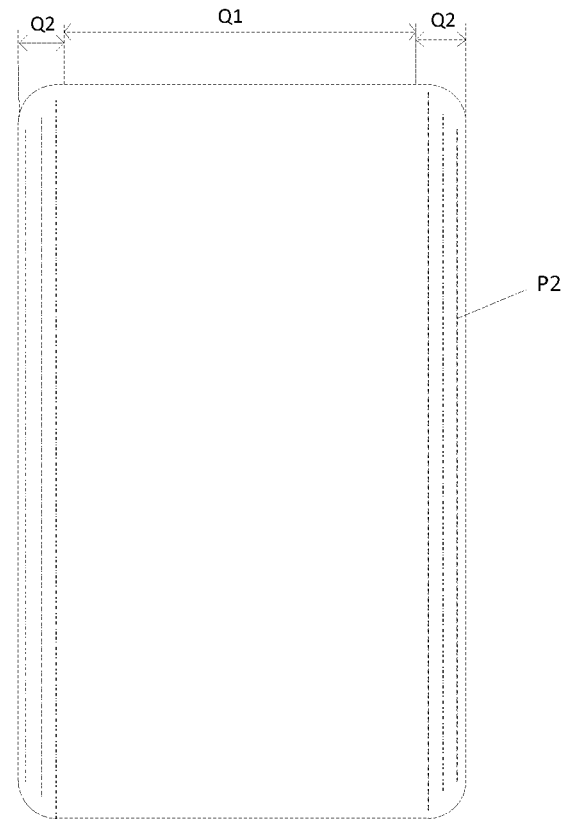
FIG. 7 is a schematic diagram of a structure of an array substrate according to an embodiment of the present disclosure.

In some embodiments, FIG. 7 is a schematic diagram of a structure of an array substrate according to an embodiment of the present disclosure. As shown in FIG. 7, the array substrate is divided into a flat region Q1 and bending regions Q2. A plurality of light-emitting devices are disposed in the flat region Q1 and the bending regions Q2. An orthographic projection of an anode of each of at least some light-emitting devices located in the bending regions Q2 on the base substrate covers an orthographic projection of at least one adjusting portion on the base substrate. That is, at least one adjusting portion with stepped lateral sides is disposed below an anode of any one of the at least some light-emitting devices in the bending regions Q2.

For example, the array base substrate shown in FIG. 7 is used for a mobile phone including a waterfall screen, and the array substrate includes a flat region Q1 in the middle of a screen and bending regions Q2 arranged at edges of the screen. A plurality of light-emitting devices, including, but being not limited to, green light-emitting devices, red light-emitting devices and blue light-emitting devices, are arranged in the flat region Q1 and the bending regions Q2. In this embodiment, one or more adjusting portions with stepped lateral sides may be provided below an anode of at least one blue light-emitting device in the bending regions Q2, and an adjusting portion may be absent in the flat region Q1. In this way, the amount of light in the non-vertical direction reflected by the anodes of the blue light-emitting devices in the bending regions Q2 may be increased without changing a display area of a front surface of the screen. Further, the luminance ratio of the light-emitting devices of different colors in the bending regions Q2 is improved, and the display effect is improved.

In a second aspect, an embodiment of the present disclosure provides a display apparatus, which includes the array substrate provided in any of the above embodiments. The display apparatus may be an electronic apparatus with a display panel, such as a mobile phone including a waterfall screen, a folding screen or the like, a tablet computer, an electronic watch, a sports bracelet, a notebook computer or the like. The technical effects which may be achieved by the display apparatus may refer to the above discussion for the technical effects achieved by the array substrate, and are not described herein again.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. An array substrate, comprising:
   a base substrate;
   at least one adjusting portion on the base substrate, wherein the at least one adjusting portion has a first cross section in a plane perpendicular to the base substrate; the first cross section comprises a top side and a bottom side, and a first lateral side and a second lateral side; wherein the bottom side is closer to the base substrate than the top side, and an orthographic projection of the top side on the base substrate is within an orthographic projection of the bottom side on the base substrate; at least one of the first lateral side and the second lateral side is stepped;
   a buffer layer on a side of the at least one adjusting portion away from the base substrate; and a plurality of light-emitting devices on a side of the buffer layer away from the base substrate, wherein each of the plurality of light-emitting devices comprises a first electrode, a light-emitting layer and a second electrode which are sequentially arranged along a direction away from the base substrate; and an orthographic projection of a first electrode of each of at least some of the plurality of light-emitting devices on the base substrate at least covers an orthographic projection of a respective one of the at least one adjusting portion on the base substrate.

2. The array substrate of claim 1, wherein
the first lateral side and the second lateral side are stepped, and are symmetrically arranged about a line passing through middle points of the top side and the bottom side as a symmetric axis.

3. The array substrate of claim 2, wherein
the at least one adjusting portion comprises a plurality of adjusting sub-structures sequentially stacked along the direction away from the base substrate, and
areas of the plurality of adjusting sub-structures decrease sequentially along the direction away from the base substrate.

4. The array substrate of claim 3, wherein
the plurality of adjusting sub-structures comprise two adjusting sub-structures.

5. The array substrate of claim 4, wherein
each of the plurality of adjusting sub-structures is made of an inorganic material.

6. The array substrate of claim 5, wherein
the plurality of light-emitting devices form a plurality of pixel units, light-emitting devices in each of the plurality of pixel units comprises a red light-emitting device, a green light-emitting device, and a blue light-emitting device; and
an orthographic projection of a first electrode of the blue light-emitting device on the base substrate covers an orthographic projection of at least one adjusting portion on the base substrate.

7. The array substrate of claim 5, wherein
the at least one adjusting portion comprises a plurality of adjusting portions separated from each other; and
first electrodes of at least some of the plurality of light-emitting devices covers the plurality of adjusting portions.

8. The array substrate of claim 5, wherein
the array substrate comprises a flat region and at least one bending region; and
an orthographic projection of a first electrode of each of at least some of the plurality of light-emitting devices in the at least one bending region on the base substrate covers an orthographic projection of the at least one adjusting portion on the base substrate.

9. The array substrate of claim 5, wherein
the buffer layer is made of an organic material.

10. The array substrate of claim 1, wherein
the at least one adjusting portion comprises a plurality of adjusting sub-structures sequentially stacked along the direction away from the base substrate, and
areas of the plurality of adjusting sub-structures decrease sequentially along the direction away from the base substrate.

11. The array substrate of claim 10, wherein
the plurality of adjusting sub-structures comprise two adjusting sub-structures.

12. The array substrate of claim 10, wherein
each of the plurality of adjusting sub-structures is made of an inorganic material.

13. The array substrate of claim 12, wherein
the plurality of light-emitting devices form a plurality of pixel units, light-emitting devices in each of the plurality of pixel units comprises a red light-emitting device, a green light-emitting device, and a blue light-emitting device; and
an orthographic projection of a first electrode of the blue light-emitting device on the base substrate covers an orthographic projection of at least one adjusting portion on the base substrate.

14. The array substrate of claim 12, wherein
the at least one adjusting portion comprises a plurality of adjusting portions separated from each other; and
first electrodes of at least some of the plurality of light-emitting devices covers the plurality of adjusting portions.

15. The array substrate of claim 1, wherein
each of the plurality of adjusting sub-structures is made of an inorganic material.

16. The array substrate of claim 1, wherein
the plurality of light-emitting devices form a plurality of pixel units, light-emitting devices in each of the plurality of pixel units comprises a red light-emitting device, a green light-emitting device, and a blue light-emitting device; and
an orthographic projection of a first electrode of the blue light-emitting device on the base substrate covers an orthographic projection of at least one adjusting portion on the base substrate.

17. The array substrate of claim 1, wherein
the at least one adjusting portion comprises a plurality of adjusting portions separated from each other; and
first electrodes of at least some of the plurality of light-emitting devices covers the plurality of adjusting portions.

18. The array substrate of claim 1, wherein
the array substrate comprises a flat region and at least one bending region; and
an orthographic projection of a first electrode of each of at least some of the plurality of light-emitting devices in the at least one bending region on the base substrate covers an orthographic projection of the at least one adjusting portion on the base substrate.

19. The array substrate of claim 1, wherein
the buffer layer is made of an organic material.

20. A display apparatus, comprising the array substrate claim 1.

* * * * *